United States Patent
Vendt et al.

(10) Patent No.: US 10,088,188 B2
(45) Date of Patent: Oct. 2, 2018

(54) ROTATABLE WALL-MOUNTED THERMOSTAT HAVING A LEVELING FEATURE

(71) Applicant: Lennox Industries Inc., Richardson, TX (US)

(72) Inventors: Stephen J. Vendt, Lewisville, TX (US); Steve Lazar, San Antonio, TX (US)

(73) Assignee: Lennox Industries Inc., Richardson, TX (US)

( * ) Notice: Subject to any disclaimer, the term of this patent is extended or adjusted under 35 U.S.C. 154(b) by 145 days.

(21) Appl. No.: 14/974,065

(22) Filed: Dec. 18, 2015

(65) Prior Publication Data

US 2016/0178230 A1   Jun. 23, 2016

Related U.S. Application Data (60) Provisional application No. 62/095,582, filed on Dec. 22, 2014.

(51) Int. Cl.
| | |
|---|---|
| F24F 11/00 | (2018.01) |
| F24F 11/30 | (2018.01) |
| F24F 13/20 | (2006.01) |
| F24F 13/32 | (2006.01) |
| G05D 23/19 | (2006.01) |
| F24F 11/52 | (2018.01) |

(52) U.S. Cl.
CPC .......... *F24F 11/0086* (2013.01); *F24F 11/30* (2018.01); *F24F 13/20* (2013.01); *F24F 13/32* (2013.01); *G05D 23/1905* (2013.01); *F24F 11/52* (2018.01)

(58) Field of Classification Search
CPC .............................. F24F 13/32; G05D 23/1905
USPC .......................................................... 236/94
See application file for complete search history.

(56) References Cited

U.S. PATENT DOCUMENTS

| | | | | |
|---|---|---|---|---|
| 3,064,103 | A * | 11/1962 | Biermann | H05B 1/0213 236/68 B |
| 3,190,988 | A * | 6/1965 | Graham | G05D 23/1951 236/68 B |
| 3,975,703 | A | 8/1976 | Andresen, Jr. | |
| 5,138,134 | A | 8/1992 | Ellison | |
| 7,614,567 | B2 | 11/2009 | Chapman, Jr. et al. | |
| 8,511,577 | B2 | 8/2013 | Warren et al. | |
| 8,553,149 | B2 * | 10/2013 | Ansfield | H04N 5/64 348/569 |

(Continued)

OTHER PUBLICATIONS

Honeywell, Lyric Installation Guide, http://lyric.honeywell.com/pdf/lyric-install-quick-start-guide-pdf_d8.pdf, downloaded May 2, 2016, 9 pages.

(Continued)

*Primary Examiner* — David Teitelbaum
*Assistant Examiner* — Paul Schwarzenberg
(74) *Attorney, Agent, or Firm* — Hubbard Johnston, PLLC (57) ABSTRACT

This disclosure is directed to an electronic thermostat for a heating, ventilation, and air conditioning (HVAC) system that includes an electronic level feature and leveling register that allow the thermostat housing to be rotated about a mounting wall plate to place the thermostat housing in a leveled position. In one aspect, the thermostat includes at least one accelerometer. Other systems and methods are disclosed.

14 Claims, 7 Drawing Sheets

(56) References Cited

U.S. PATENT DOCUMENTS

| | | | | |
|---|---|---|---|---|
| 2010/0146308 A1* | 6/2010 | Gioscia | ................ | G06F 1/1632 |
| | | | | 713/300 |
| 2014/0175181 A1* | 6/2014 | Warren | ................ | G05D 23/19 |
| | | | | 236/51 |
| 2014/0217186 A1 | 8/2014 | Kramer et al. | | |
| 2014/0355200 A1* | 12/2014 | Thiers | ................ | H04W 88/02 |
| | | | | 361/679.41 |

OTHER PUBLICATIONS

Nest Labs, Inc., Learning Thermostat Installation Guide, https://nest.com/support/article/Download-Nest-Thermostat-documents-and-get-started-using-your-thermostat, downloaded May 2, 2016, 24 pages.

Nest Labs, Inc., Welcome Guide, https://nest.com/support/images/000001160/WelcomeGuide.pdf, downloaded May 2, 2016, 10 pages.

Nest Labs, Inc., Welcome Home, https://nest.com/support/images/misc-nest-thermostat/3rd-gen-thermostat-welcome-guide-US.pdf, downloaded May 2, 2016, 2 pages.

IHandy Level Free, version 1.70.2, , iHandy Inc., AppStore, screenshot of link obtained on May 2, 2016, 2 pages.

International Search Report and Written Opinion received in corresponding Patent Cooperation Treaty Application No. PCT/US2015/066604, dated Feb. 23, 2016, 8 pages.

\* cited by examiner

ROTATABLE WALL-MOUNTED THERMOSTAT HAVING A LEVELING FEATURE

RELATED APPLICATION

The present application claims the benefit of the filing of U.S. Provisional Patent Application Ser. No. 62/095,582, entitled "Wall Thermostat Having a Leveling Indicator and Register," filed Dec. 22, 2014, which is incorporated herein in its entirety by reference for all purposes.

TECHNICAL FIELD

This disclosure is directed to heating and ventilation air conditioning (HVAC) equipment and systems, and more particularly, but without limitation, to rotatable wall-mounted thermostats having a leveling feature.

BACKGROUND

Wall-mounted thermostats used to control HVAC units have been used for decades. Conventional wall-mounted thermostats typically anchor to the wall by screws, bolts or are snapped into an in-wall housing that is anchored to the wall, and within an air-conditioned area that is controlled by the thermostat. Although the functionality of thermostats has evolved over the years, the method for attaching thermostats to the wall has remained largely unchanged. One problem associated with conventional wall-mounted thermostats is that an installer may inadvertently level the thermostat housing incorrectly, which causes the thermostat to have an unleveled appearance. Another problem is that a nearby door molding or other trim may be unleveled, causing the thermostat to appear that it is unleveled. Consequently, once in place, it is difficult to change the attachment of conventional thermostats to a wall because the thermostat and accompanying base must be removed, previous screw holes patched, and the thermostat reattached to the wall in a leveled fashion. As used throughout this document, "or" does not require mutual exclusivity unless explicitly noted.

SUMMARY

According to an illustrative, non-limiting embodiment, a wall-mounted thermostat system for use as an aspect of a heating, ventilation, and air conditioning (HVAC) system includes a wall-mounting base having a first side and a second side. The first side of the wall-mounting base is configured at least in part to mount against the wall. The system also includes a thermostat rotatably coupled to the wall-mounting base on the second side of the wall-mounting base. The thermostat includes a first accelerometer for developing leveling data with respect to a plane parallel to the wall. The system also includes a rotatable interface between the wall-mounting base that allows the thermostat to move relative to the wall-mounting base and provides electrical communication between the thermostat and the wall-mounting base. The rotatable interface comprises a leveling register. The leveling register may enable the rotation or may hold the thermostat in position relative to the wall-mounting base with respect to rotation.

According to another illustrative, non-limiting embodiment, a method of coupling a thermostat to a wall and leveling the thermostat includes providing a wall-mounting base, attaching the wall-mounting base to the wall, and providing a thermostat that includes an accelerometer for providing leveling information. The method also involves rotatably coupling the thermostat to the wall-mounting base, using the accelerometer to develop the leveling information concerning which direction of rotation is required between the wall-mounting base and the thermostat to make the thermostat level, and rotating the thermostat relative to wall-mounting base based on leveling information provided by the accelerometer.

According to one illustrative embodiment of this disclosure, a thermostat that has a leveling indicator and leveling register incorporated into the thermostat is provided. In one embodiment, the thermostat has a user-activated electronic leveling function that appears on the display. The user activates the electronic leveling function by selecting the appropriate menu selection on the display screen of the thermostat. Once the user engages the leveling function, a leveling icon or other leveling indicia appear on the screen that the user uses to level the thermostat on the wall.

According to another aspect of the disclosure, in one illustrative embodiment, the thermostat's housing includes a physical bubble-type level built into the frame of the thermostat's housing that the user can use to level the thermostat on the wall. In addition, the back of the thermostat housing includes a leveling register that cooperates with a corresponding leveling register on a wall-mounting base to provide a mechanism for allowing the thermostat housing to freely or incrementally rotate with respect to the wall-mounting base to achieve a leveled condition as indicated by the level indicator. The cooperating leveling registers of the thermostat and the wall-mounting base may comprise a number of different systems for allowing the free or indexed rotation of the thermostat about the wall-mounting base. These features provide the user with a system by which the user can level a thermostat in an easy and convenient manner, without the need to remove the wall-mounting base, screws, patch holes, or re-mount the wall-mounting base in an attempt to level the thermostat.

BRIEF DESCRIPTION

Reference is now made to the following descriptions taken in conjunction with the accompanying drawings, in which.

DETAILED DESCRIPTION

Figure 1A:
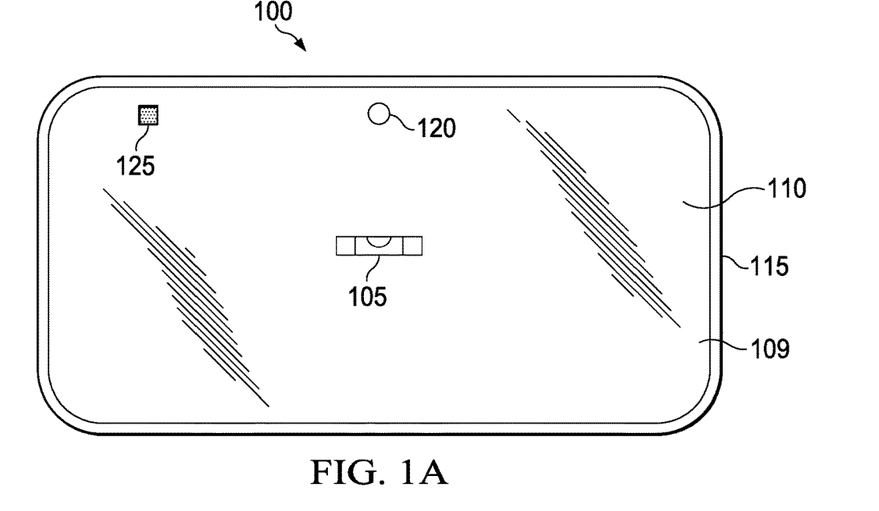
FIG. 1A is a schematic front view of an illustrative embodiment of an HVAC thermostat according to an aspect of the present disclosure

Referring now to the drawings, and initially to FIG. 1A, a front view of one embodiment of a wall mountable thermostat 100 for use as an aspect of a heating, ventilation, and air conditioning (HVAC) system is presented. The thermostat has a first side 107 (FIG. 2) and second 109. The thermostat 100 includes a level indicator 105 that in one embodiment is a virtual level indicator that appears on a display or touchscreen 110. The level indicator 105 may appear when a user initiates a leveling function of the thermostat 100. The position of the level indicator 105, in those embodiments where it is a virtual image of a level indicator, is exemplary only, and it might appear in other locations on the screen 110, such as a corner. In another embodiment, the level indicator 105 is incorporated into the frame 115 near an outer edge of the thermostat 100. As explained below, in those embodiments where the level indicator 105 is a virtual or displayed image, the thermostat 100 will include leveling circuitry that allows the level to appear and function in the intended manner. Leveling circuitry is circuitry that causes a virtual level indicator 105 to appear on the display screen 105 and allows it to function as a leveling device by presenting leveling indicia on the screen 110. The leveling circuitry includes an accelerometer, an inclinometer, or other motion detection device, and circuitry that allow the thermostat 100 to be "tilt aware" and detect or sense an orientation of the thermostat 100. Other components that might be present in various embodiments are a video camera 120, associated video circuitry, and an audio speaker 125 and associated audio circuitry.

In at least some embodiments, one or more accelerometers may be included to provide the desired leveling information. One accelerometer may provide information regarding position of the thermostat 100 in a plane substantially parallel to the wall when mounted. If a second accelerometer is included, the other accelerometer may provide information regarding position of the thermostat 100 relative to a plane that is substantially orthogonal to the plane of the wall. Thus, the thermostat 100 includes a first accelerometer for developing leveling data with respect to a plane parallel to the wall, and in this embodiment, includes a second accelerometer that develops leveling information with respect to the tilt of the thermostat away from the wall.

The wall mountable thermostat 100 is shown as a rectangular member, but it should be understood that the wall mountable thermostat 100 may take any of numerous shapes. For example, wand without limitation, the thermostat 100 may be round, square, irregular shaped, etc.

Figure 1B:
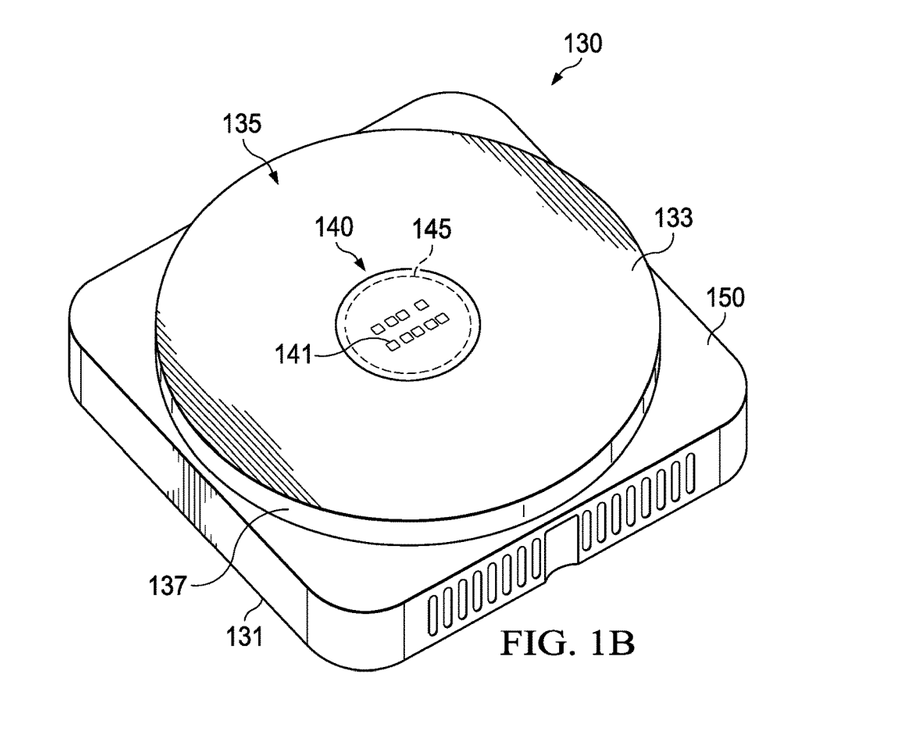
FIG. 1B is a schematic, perspective view of an illustrative embodiment of a wall-mounting base according to an aspect of the present disclosure.

Referring now primarily to FIG. 1B, an embodiment of a wall-mounting base 130 to which the thermostat 100 may be mounted is presented. The wall-mounting base 130 has a first side 131 and a second side 133. The second side 133 is configured to mount against the wall. The wall-mounting base 130 may take any shape as desired but is configured to have at least one surface for receiving the wall mountable thermostat 100. In this particular embodiment, the wall-mounting base 130 includes a mounting area 135 upon or in which the thermostat 100 is mounted, depending on the configuration. The thermostat 100 is rotatably coupled to the wall-mounting base 130 on the second side 133 of the wall-mounting base 130.

The mounting area 135 may be a flat area, a recessed area, or a raised cylindrically shaped area, or other shaped-area. In the illustrated embodiment, the mounting area 135 is a raised area 137 that is sized for its reception into a recessed mounting area 217 (FIGS. 2, 3, and 4) of the thermostat 100. An electrical contact interface 140 is located within the mounting area 135. The electrical contact interface 140 facilitates electrical connection, including data or power or both, between the wall-mounting base 130 and the thermostat 100. In the illustrated embodiment, the electrical contact interface 140 comprises a plurality of spaced-apart conductive contact points 141 on the wall-mounting base 130 and that cooperate with the thermostat-electrical-contact interface 220 (FIG. 2) on the thermostat 100. The spaced-apart conductive contact points 141 may be metallic and comprised of copper, silver or gold, etc., or of a base metal, such as nickel, plated with one or more such conductive metals. However, in another embodiment, the contact interface 140 may concentric conductive rings on the second side of the wall-mounting base 130 comprised of these same materials. In other embodiments, the electrical contact interface 140 may have either a male or female pin connector configuration connected to the thermostat 100 that allows rotation of the thermostat 100 about the wall-mounting base 130.

The wall mountable thermostat 100 may be coupled to the wall-mounting base 130 in a number of ways, e.g., magnetic, mechanical, or other means, that allow rotation of the wall mountable thermostat 100 with respect to the wall-mounting base 130. In some embodiments, the wall mountable thermostat 100 may be readily released from the wall-mounting base 130 and in others may be more difficult or not releasable.

In one illustrative embodiment, an optional magnetic element 145 is present and shown in dashed lines to indicate a preferable location within a housing 150 of the wall-mounting base 130 and is present in certain embodiments. The magnetic element 145 may be comprised of a natural magnetic material, or it may be an electro-magnet member. In one embodiment, as shown, the magnetic element 145 is located in the center of the mounting area 135. In such embodiments, the magnetic element 145 holds the thermostat 100 to the wall-mounting base 130, while allowing rotation of the thermostat 100 to occur relative to the wall-mounting base 130. The magnetic element 145 may be located within the wall-mounting base housing 150 and be properly shielded, if required. In alternative embodiments and in place of the magnetic element 145, a metal plate or other magnetically attractive material may be present and used to attach to a magnet that is located in the thermostat 100. In other embodiments, the magnetic element 145 is not necessary, when other coupling methods are used, an example of which is discussed below.

Figure 2:
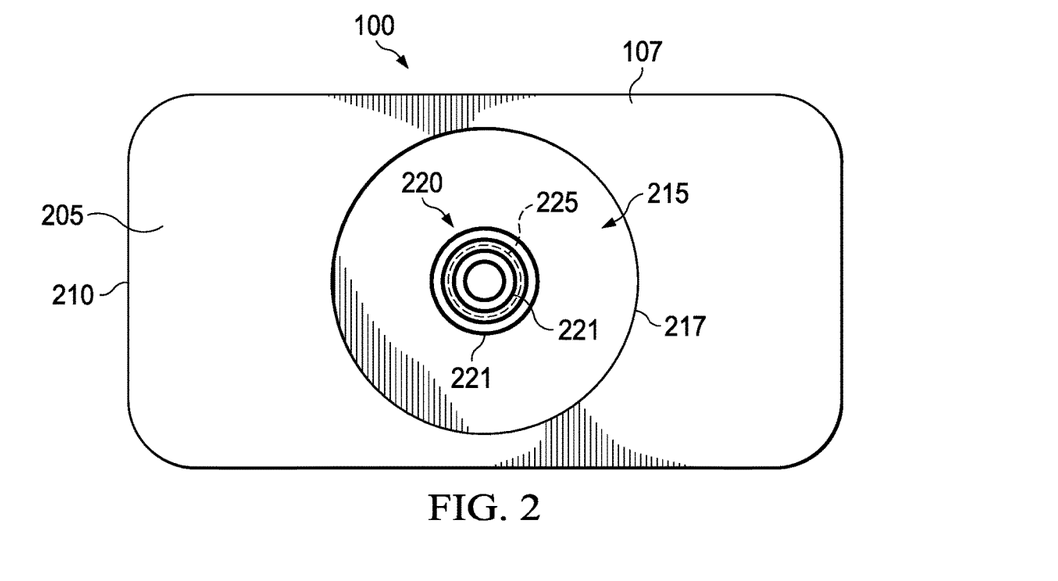
FIG. 2 is a schematic back view of the illustrative thermostat of FIG. 1A according to an aspect of the present disclosure.

Referring now primarily to FIG. 2, a rear view of the thermostat 100 of one illustrative embodiment is presented. In this view, it may be appreciated that a backside 205 together with the display screen 105 (FIG. 1) form a thermostat housing 210. The mounting area 215 is the area of the backside 205 used to mount the thermostat housing 210 to the wall-mounting base 130. The mounting area 215 may be a flat area, a recessed area, a raised cylindrically shaped area, or an area with some other shape that allows rotation. In the illustrated embodiment, the mounting area 215 is a recessed area 217 that that is sized to allow its reception of the mounting area 135 of the wall-mounting base 130 (FIG. 1B). It will be appreciated that in other embodiments, the mounting area 215 may be raised and the mounting area 135 of the wall-mounting base 130 may be recessed.

Located within the mounting area 215 of the illustrative embodiment is an electrical contact interface 220. The thermostat electrical contact interface 220 provides electrical connection between the thermostat 100 and the electrical contact interface 140 (FIG. 1B) on the wall-mounting base 130 for transmitting data, power, or both. In the illustrated embodiment, the contact interface 220 comprises concentric conductive rings 221. The conductive rings 221 may use any suitable material for conducting electrical flow, such as a metallic member comprised of copper, silver, or gold, etc., or a base metal, such a nickel, plated with one or more of such conductive metals. Alternatively, the contact interface 220 comprises a plurality of spaced-apart conductive contact points comprised of the same type of metallic materials or other electrical contacts coordinated to interface with the electrical contact interface 140 of the wall-mounting base 130. In some embodiments, the electrical contact interface 220 may have either a male or female pin connector configuration connected to the thermostat 100 that allows rotation of the thermostat 100 about the wall-mounting base 130.

The electrical contact interface 220 coordinates with the electrical contact interface 140 on the wall-mounting base 130 to allow electrical communication there between and together is referred to as an electrical surface electrical subsystem or scheme. This electrical surface electrical contacting scheme provides a convenient way by which the thermostat housing 210 couples electrically to the wall-mounting base 130. This surface connection system allows rotation between the thermostat housing 210 and the wall-mounting base 130 to occur while providing data or power connectivity to the thermostat 100. The surface contact points maintain electrical connection to the thermostat 100, even during the leveling process of the thermostat housing 210. Additionally, the surface contacts allow for easy removal of the thermostat housing 210 from the wall-mounting base 130, and thereby provides, for a portable thermostat that can be carried by user throughout the conditioned space.

In the installed position, the wall-mounting base 130 is attached to the wall the thermostat 100 is rotatably coupled to the wall-mounting base. To rotatably couple the wall-mounting base 130 to the thermostat 100, at least one magnetic element may be used or mechanical scheme may be used. With reference to an embodiment for the former, a magnetic element 225, which is shown in dashed lines to indicate one possible location within the thermostat housing 210, may also be present. The magnetic element 225 may be comprised of a natural magnetic material or may be an electro-magnet. In one embodiment, as shown, the magnetic element 225 is located in the center of the mounting area 215 that can be used to hold the thermostat 100 to the wall-mounting base 130, while allowing rotation of the thermostat housing 210 to occur relative to the wall-mounting base 130. The magnetic element 225 may be located within the thermostat housing 210 and properly shielded, if required.

Figure 7:
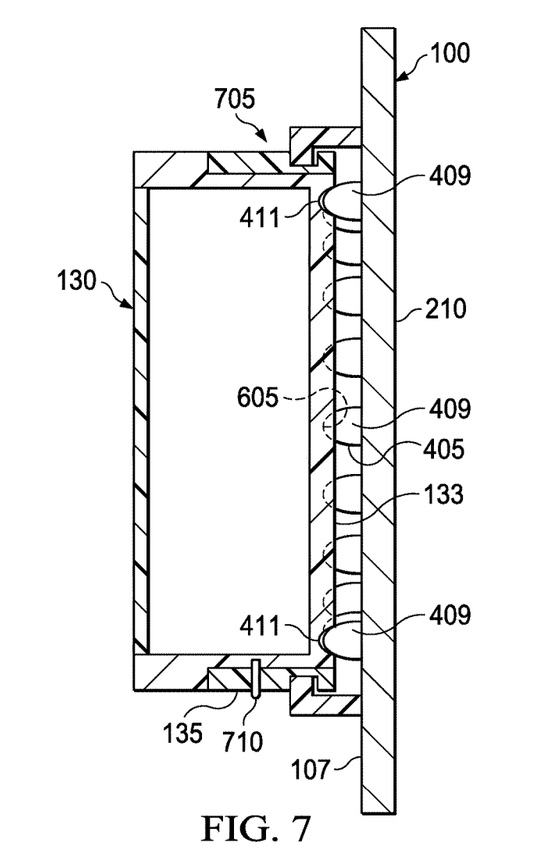
FIG. 7 is a schematic sectional view of one embodiment of the thermostat showing one type of coupling mechanism that can be used to hold the thermostat onto the wall-mounting base, while still providing rotation of the thermostat about the wall-mounting base.

In alternative embodiments and in place of the magnetic element 225, a metal plate may be present and used to attach to a magnet located on the wall-mounting base 130. Both sides may have coordinated magnets, one may have metal and the other a magnet, or no magnets may be involved. In some embodiments, the magnetic element 225 is not necessary, when other couplings methods, e.g., the mechanical method shown in FIG. 7, are used, an example of which is discussed below.

At times, it is desirable to move the thermostat 100 relative to the wall-mounting base or plate, e.g., wall-mounting base 130, while continuing to transmit electrical signals and without requiring disassembly or re-installation of the thermostat 100. In leveling the thermostat 100, it is desirable to rotate the thermostat 100 relative to the wall-mounting base 130 and to hold the relative position of the thermostat 100 and the wall-mounting base or plate 130 once leveled. A leveling register may assist or enable one or more of these functions, i.e., with allowing rotation and optionally maintaining the relative position of the thermostat 100 and the wall-mounting base 130.

Figure 3:
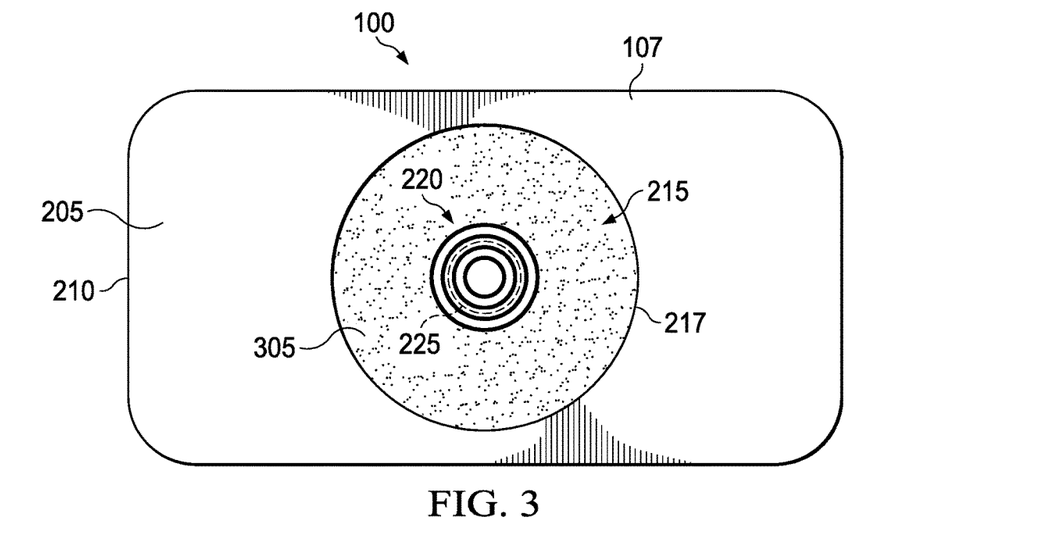
FIG. 3 is a schematic back view of the illustrative thermostat of FIG. 1A according to an aspect of the present disclosure showing one embodiment of a leveling register as positioned within a mounting area of the back side of the thermostat.

Referring now primarily to FIG. 3, a rear view of the thermostat 100 of FIG. 1 is shown that includes a leveling register 305 located within the mounting area 215. As used herein, a "leveling register" is a mechanism that allows the thermostat housing 210 to rotate about the wall-mounting base 130 in a controlled or incremental fashion. In certain embodiments, the leveling register also functions to hold the thermostat 100 to the wall-mounting base 130, upon completion of the desired degree of rotation, while in other embodiments, a separate coupling mechanism is used. In one embodiment, the leveling register 305 may comprise a roughened or grit-type surface, similar to sand paper that provides adequate friction between the leveling register 305 and the mounting area 135 of the wall-mounting base 130 to hold the thermostat 100 in a leveled position.

Figure 4:
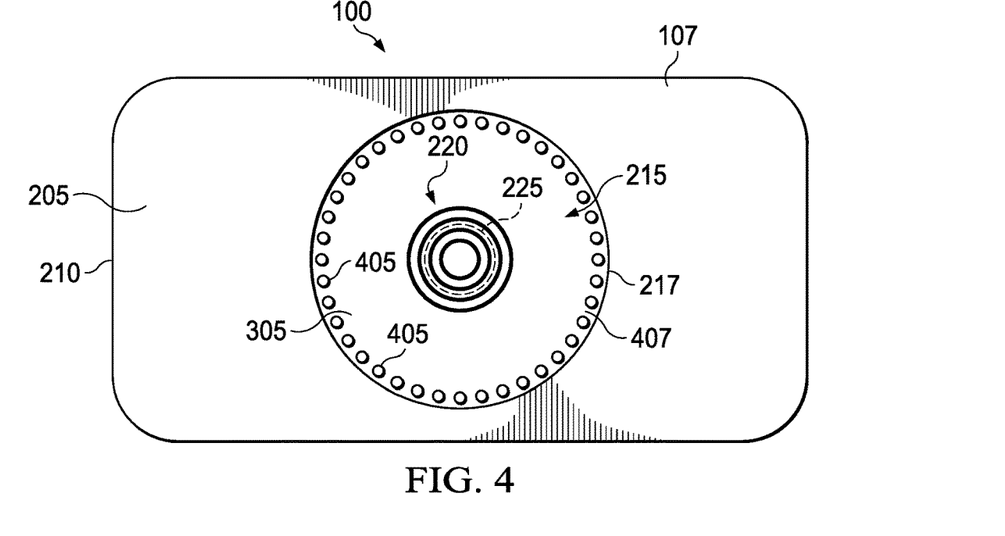
FIG. 4 is a schematic back view of the illustrative thermostat of FIG. 1A according to an aspect of the present disclosure showing another embodiment of a leveling register as positioned within a mounting area of the back side of the thermostat.

Referring now primarily to FIG. 4, another embodiment of the leveling register 305 of the thermostat 100 is presented that comprises one or more register elements 405. In one embodiment, the register elements 405 are located about an inner or outer circumference 407, or circumferential path, of the mounting area 215, as seen in FIG. 4. It should be noted that though the illustrated embodiment shows a plurality of register elements 405, in other embodiments, only one register element, such as a magnet, may be present. In those embodiments that include a plurality of register elements 405, the register elements 405 may be located about an inner circumference (inboard of 407) of the mounting area 215 or distributed about only a portion of the perimeter of the mounting area 215 (e.g., 180° or less). In such embodiments, the objective is to have a sufficient number of register elements 405 located around the mounting area 215 to provide the degree of increments necessary to properly level the thermostat 100. As explained below, these register elements 405 cooperatively engage corresponding register elements on the wall mounting plate 130.

The register elements 405 are schematically shown and generally illustrative of a number of different mechanical configurations and systems that allow the thermostat housing 210 to be rotated in a controlled manner with respect to the wall-mounting base 130. For example, in one embodiment, the register elements 405 are a plurality of magnets located within the mounting area 215 and the thermostat housing 210, and represent either a plurality of indentations, or protrusions that extend outwardly from the mounting area 215. As shown in FIG. 7, the plurality of register elements 405 may also be biased elements that are urged into a plurality of indentations.

Figure 5:
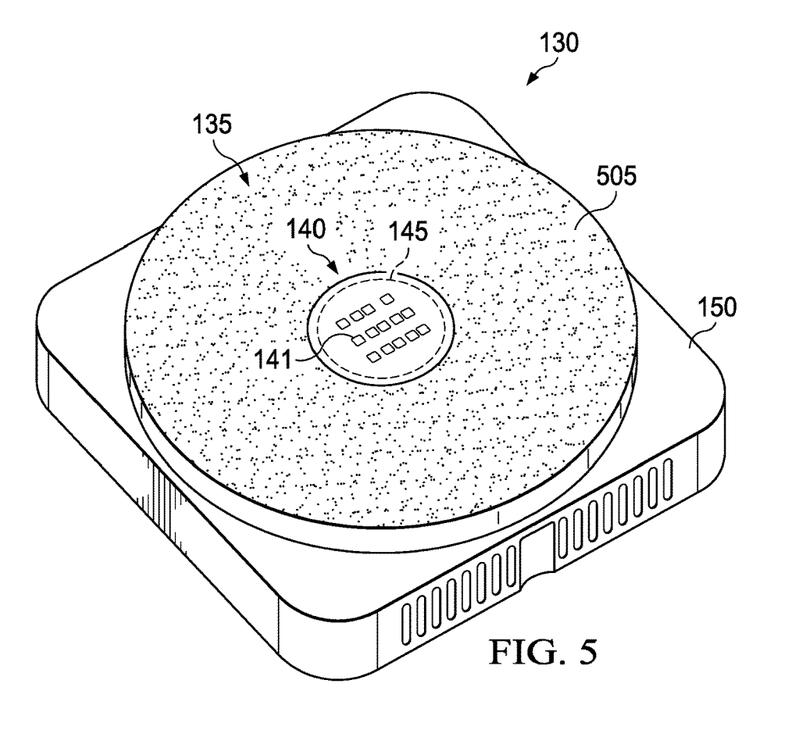
FIG. 5 is a schematic perspective view of a wall mounting plate according to an aspect of the present disclosure showing one aspect of a leveling register as positioned within a mounting area of the wall-mounting base and also illustrating a corresponding electrical connector.

Referring now primarily to FIG. 5, the wall-mounting base 130 of FIG. 1B that includes a leveling register 505 located within the mounting area 135 is presented. In one embodiment, the leveling register 505 comprises a roughened or grit-type surface, similar to sand paper that provides adequate friction to hold the thermostat 100 in place, once placed in a leveled position. That is the friction of the leveling register 505 against the mating surface of the back of the thermostat 100 allows rotations and holds the relative position once leveled.

Figure 6:
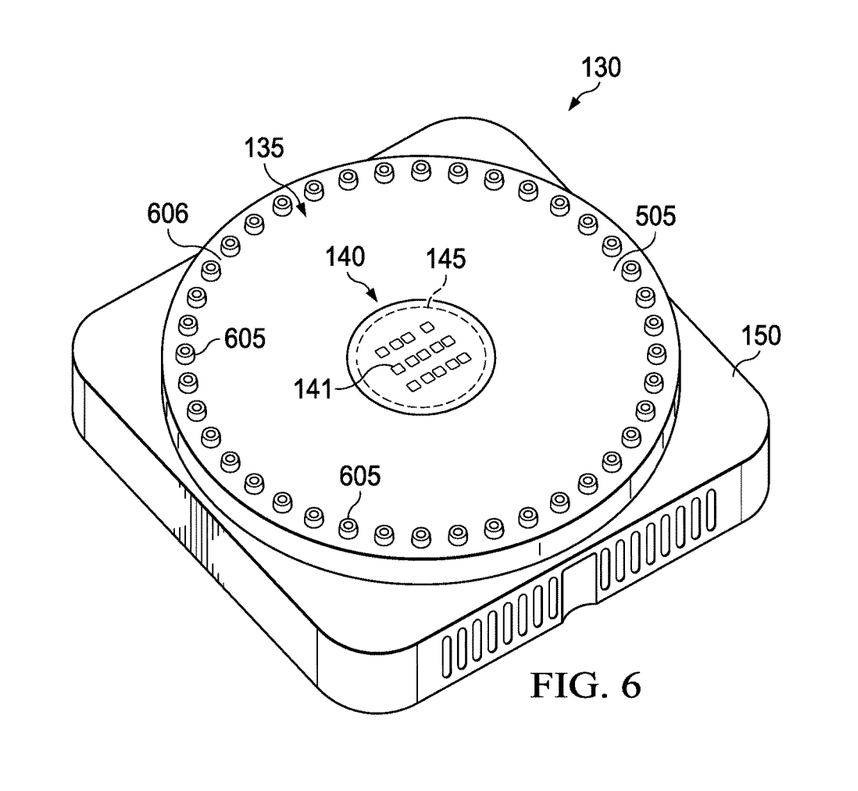
FIG. 6 is a schematic perspective view of a wall mounting plate according to an aspect of the present disclosure showing one aspect of a leveling register as positioned within a mounting area of the wall-mounting base.

The leveling register 405 may be on the thermostat 100, the wall mounting plate 130, or both. Referring now primarily to FIG. 6, another embodiment of a leveling register 505 is presented. The leveling register 505 is located within the mounting area 135 of the wall-mounting base 130 that cooperatively engages or indexes with the leveling register elements 405 of the thermostat 100, as illustrated in FIG. 4. In this embodiment, the leveling register 505 comprises one or more register elements 605 that are, in one embodiment, located about an outer circumference 606 of the mounting area 135. It should be noted that though the illustrated embodiment shows a plurality of register elements 605, in other embodiments, only one register element, such as a magnet, may be present. In those embodiments that include a plurality of register elements 605, the register elements 605 may be located about the circumference 606 of the mounting area 135 or distributed about only a portion of the perimeter of the mounting area 135 (e.g., 180° or less). In such embodiments, the objective would be to have a sufficient number of register elements 605 that cooperatively engage the register elements 405 of the thermostat 100, so that a user can properly level the thermostat 100.

The register elements 605 are schematically shown and are generally illustrative of a number of different mechanical configurations and systems that allow rotation of the thermostat housing 210 in an incremental manner with respect to the wall-mounting base 130. For example, in one embodiment, the register elements may be a plurality of magnets located within the mounting area 135 and the wall-mounting base housing 150, or may represent a plurality of indentations, or protrusions that extend outwardly from the mounting area 135 and are designed and configured to mate or cooperate with elements on the back of the thermostat 100—or vice versa.

As noted above, either one or both of the thermostat 100 and the wall-mounting base 130 may include a magnet 225, 145, respectively. In those embodiments where one magnet is used, either one or the other of the thermostat 100 or wall-mounting base 130 will have a magnet centrally located within either the mounting area 215 or mounting area 135, or both. In such embodiments, whichever of the thermostat 100 or wall-mounting base 130 that includes the magnet, the other will have a magnetically attractive plate or magnet within the mounting area, such that the opposing component will be magnetically attracted to it, thereby providing both attachment and rotation of the thermostat housing 210 about the wall-mounting base 130.

As discussed above, the register elements 405, 605 may be corresponding protrusions and indentations that allow rotation of the thermostat housing 210 about the wall-mounting base 130 in a free or an indexed fashion. In certain embodiments, the protrusions may each have an internal spring (not shown) that forces the protrusion outwardly and into the indentation and allows them to retract inwardly when a user applies sufficient rotational force to the thermostat housing 210 to achieve the desired degree of leveling. Once the thermostat 100 is level and the respective registers 405, 605 align, the springs force the protrusions outwardly into the indexed, or coordinated, indentation. Alternatively, the protrusions may simply be friction fitted into the indentations. With this disclosure, those who are skilled in the art would understand how to construct the spring biased protrusions or friction fitted protrusions.

In another embodiment, the register elements 405, 605 are corresponding teeth or gears that allow incremental rotation of the thermostat housing 210 with respect to the wall-mounting base 130. In such embodiments, the teeth or gear members possess the degree of flexibility to allow rotation in either direction. In another embodiment, the register elements 405, 605 may be a VELCRO® loop and hook system that may be separated for rotation and then applied to hold the position. The loop and hook system would provide the increments necessary for indexing the thermostat housing 210 to a leveled condition. The VELCRO® strips may be segmented or a continuous strip that circumscribes the mountings areas 215, 135, respectively. The above-discussed mechanisms are as examples only, and those skilled in the art, given the teachings of this disclosure, would understand how to construct other mechanisms to achieve the same results.

In each instance, the thermostat 100 may include at least one accelerometer to indicate information regarding leveling of the thermostat 100. If only one accelerometer is included, it will provide information on position with respect to a plane parallel to the wall on which the wall-mounting base is applied. A second accelerometer may be included that provides information on the tilt of the thermostat, i.e., with respect to a plane orthogonal to the plane of the wall. The relative tilt information or level data in the plane parallel to the wall may be provided using a synthetic or virtual level display, e.g., 105 or an audio signal any other means of communicating with an operator.

In operation according to one illustrative embodiment, once mounted to the wall-mounting base 130, if the thermostat housing 210 is not level, the user may activate a leveling function on the thermostat 100. Upon activation by the user, the level indicator 105 may appear on the screen 110, as generally shown in FIG. 1. The user may then rotate the thermostat 100 relative to the wall-mounting base 130 until the level indicator 105 indicates level. The level register will then hold the relative position. In one embodiment, an arrow indicating the direction of rotation needed may be provided and an audible indicator may sound upon reaching a level position. In another embodiment, a small electrical motor may be attached to the wall-mounting base 130 or thermostat 100 to allow automated leveling using the leveling information or to allow an operator to press buttons to cause rotation in a desired direction.

In another alternative embodiment, if a bubble level indicator is physically present and visible in the thermostat 100, the user simply rotates or otherwise adjusts the position of the thermostat 100, until the physical level indicates a leveled position of the thermostat housing 210. Using the corresponding leveling registers 405, 505, 605 of the thermostat 100 and the wall-mounting base 130, as described herein, the user indexes, or in other embodiments, freely rotates the thermostat housing 210, until the level indicator 105 indicates a level condition.

Referring now primarily to FIG. 7, an illustrative embodiment is presented in which the register elements 405 of the thermostat 100 are protrusions 409 and the register elements 605 of the wall-mounting base 130 are indentations 411. The leveling register 405 includes a plurality of register elements that are protrusions 409 coupled to the first side 107 of the thermostat 100 and biased outwardly, and the leveling register 405 includes a coordinated plurality of indentations 411 on the second side 133 of the wall-mounting base 130. In another embodiment, the protrusions 409 may be on the second side 133 of the wall-mounting base 130 and the indentations 411 may be on the first side 107 of the thermostat 100.

The embodiment of FIG. 7 also illustrates one way by which the thermostat housing 210 may remain attached to the wall-mounting base 130 when magnets are not present in either device. In this particular embodiment, the thermostat housing 210 includes a "tongue and groove" collar 705 that locks onto the protruding mounting area 135 of the wall-mounting base 130 by a collar pin 710. The collar 305 allows rotation of the thermostat housing 210 about the wall-mounting base 135, during the leveling process. The collar 705 presents only one example by which the thermostat housing 210 is rotatably coupled to the wall-mounting base 130, and other coupling systems that will be understood by those skilled in the art may be used to achieve the same results.

Figure 8:
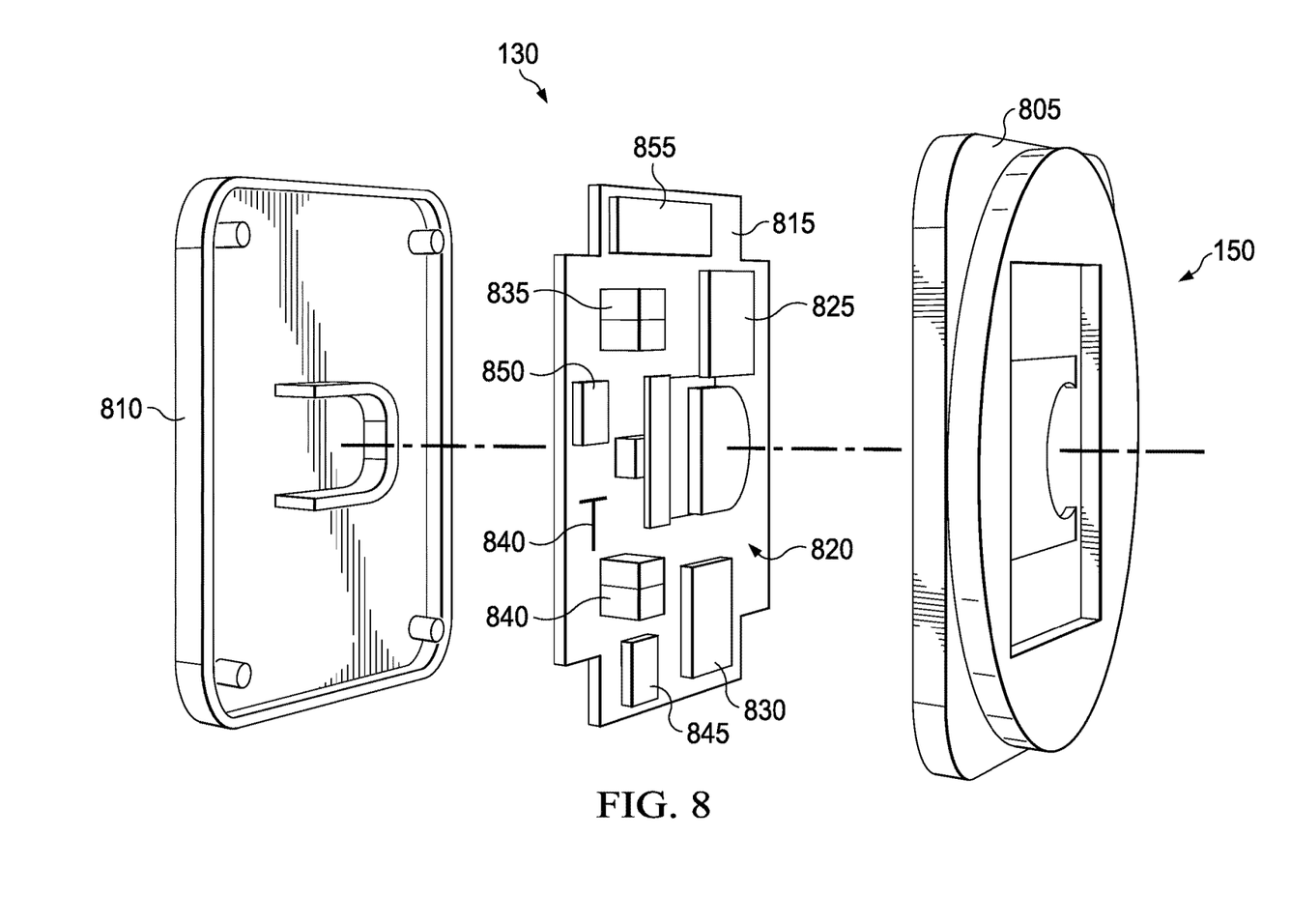
FIG. 8 is a schematic, exploded, perspective view of one embodiment of the wall-mounting base having various electronic circuitry contained therein.

Referring now primarily to FIG. 8, one illustrative embodiment of the wall-mounting base 130 is presented. As seen in this embodiment, the wall-mounting base 130 includes a front panel 805, a back panel 810 attachable to the front panel 805, which together form the a housing 150. A printed wiring or circuit board 815 is located between the front and back panels 805, 810 and within the housing 150.

In one embodiment, the electronic circuit board 815 includes various electronic components and circuitry 820 electrically connected to each other, and programmed, in an operative manner, such as a microprocessor 825, controller 830, memory 835, Wi-Fi communication circuitry 840, including an antenna, a temperature sensor 845 or humidity sensor 850, and power supply 855. In one embodiment, these various components are used to drive or provide data to the display 110, display various types of information on the display 110 (FIG. 1), and receive input requests or commands from the user directly or through a remote interface, such as a smartphone, computer, tablet, remote control, or other similar types of smart devices. As explained below with respect to other embodiments, at least a portion of these same components may be located within the thermostat housing 210 instead of the wall-mounting base 130, so that the thermostat's 100 functions are achieved directly through the thermostat 100 in place of the wall-mounting base 130.

Figure 9:
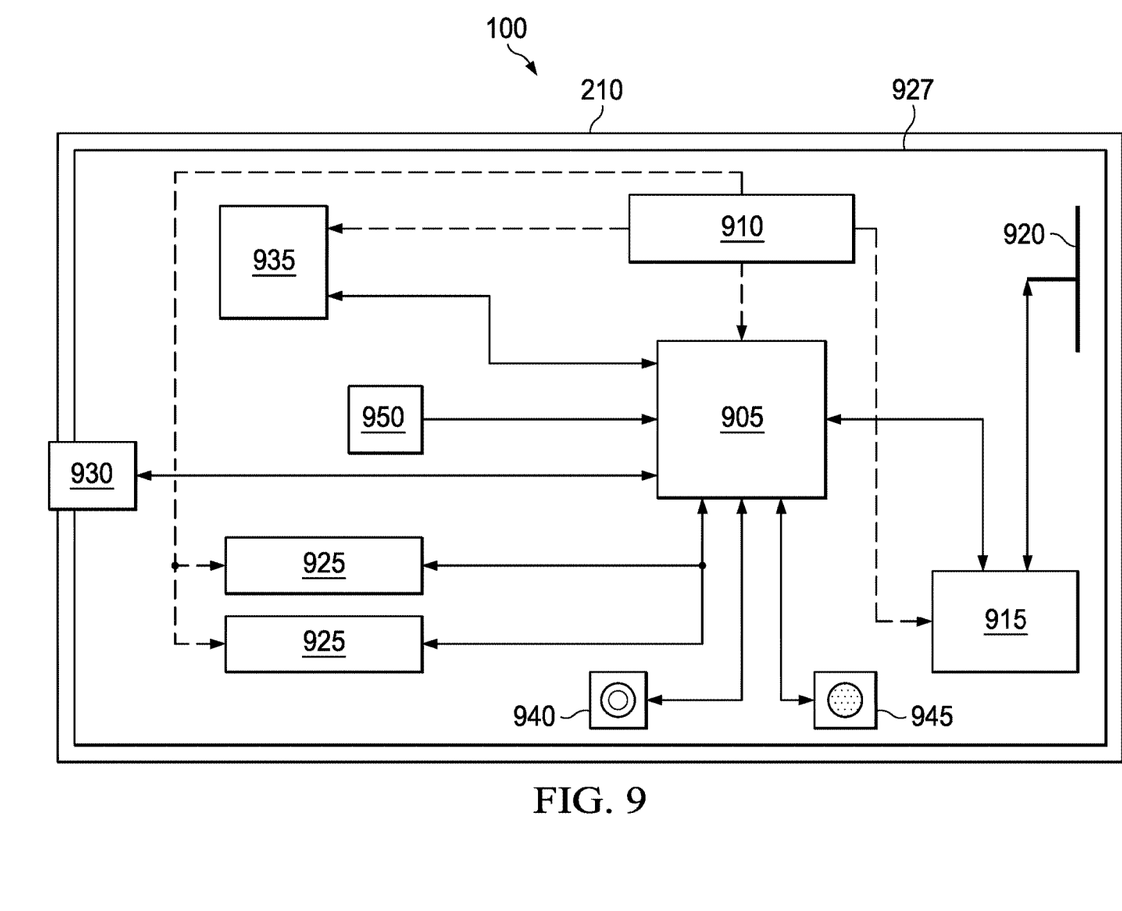
FIG. 9 is a schematic diagram illustrating one embodiment of the thermostat with the back panel removed and showing various electronic circuitry contained therein.

Referring now primarily to FIG. 9, an alternative, illustrative embodiment showing electronic circuitry located within the thermostat housing 100 is presented. This embodiment may comprise one or more of a microprocessor 905, a power supply 910, a wireless communications circuit 915, an antenna 920, and memory 925 mounted on a printed wiring or circuit board 927 that provide electrical connectivity among the various components. The memory 925 may be separate from or form a part of the microprocessor 905. An external interface port 930, as such a USB port, a temperature sensor 935, a video camera 940, an audio circuit and speaker 945, and a motion detection device 950, are also illustrated.

These components include functional programming and electrical connectivity. FIG. 9 is merely a schematic diagram of one illustrative embodiment that shows examples of the various optional components that may be packaged together or separately in a manner known to those skilled in the art. Further, the listed components are not exhaustive, and other components may be included to provide additional functionality to the thermostat 100.

In the embodiment of FIG. 9, the above-mentioned motion detection device 950, or accelerometer, has electrical connectivity to either the microprocessor 825 of the wall-mounting base 130 or the microprocessor 950 of the thermostat 100, if present. Further, the motion detection device 950 may contain the appropriate programming that causes the virtual level indicator to display on the screen 110, when a user engages the leveling function. When a user enters a leveling command, the program presents the leveling indicator 105 on the display 110, as seen in FIG. 1. The leveling indicator 105 may be a virtual indicator displayed as a bubble indicator, such as the one presented above, or it may be another virtual display of leveling indicia or even an audio signal. Once the program presents the leveling indicator 105 on the display 110, the user uses the leveling indicator to level the thermostat housing 210. In an alternative embodiment that includes a motor to rotate the thermostat 100 with respect to the wall-mounting base 130, the leveling information may be used to automatically level the thermostat 100. In those embodiments where the level indicator 105 is physically present in the thermostat display housing 210, the motion detection device is optional.

Figure 10:
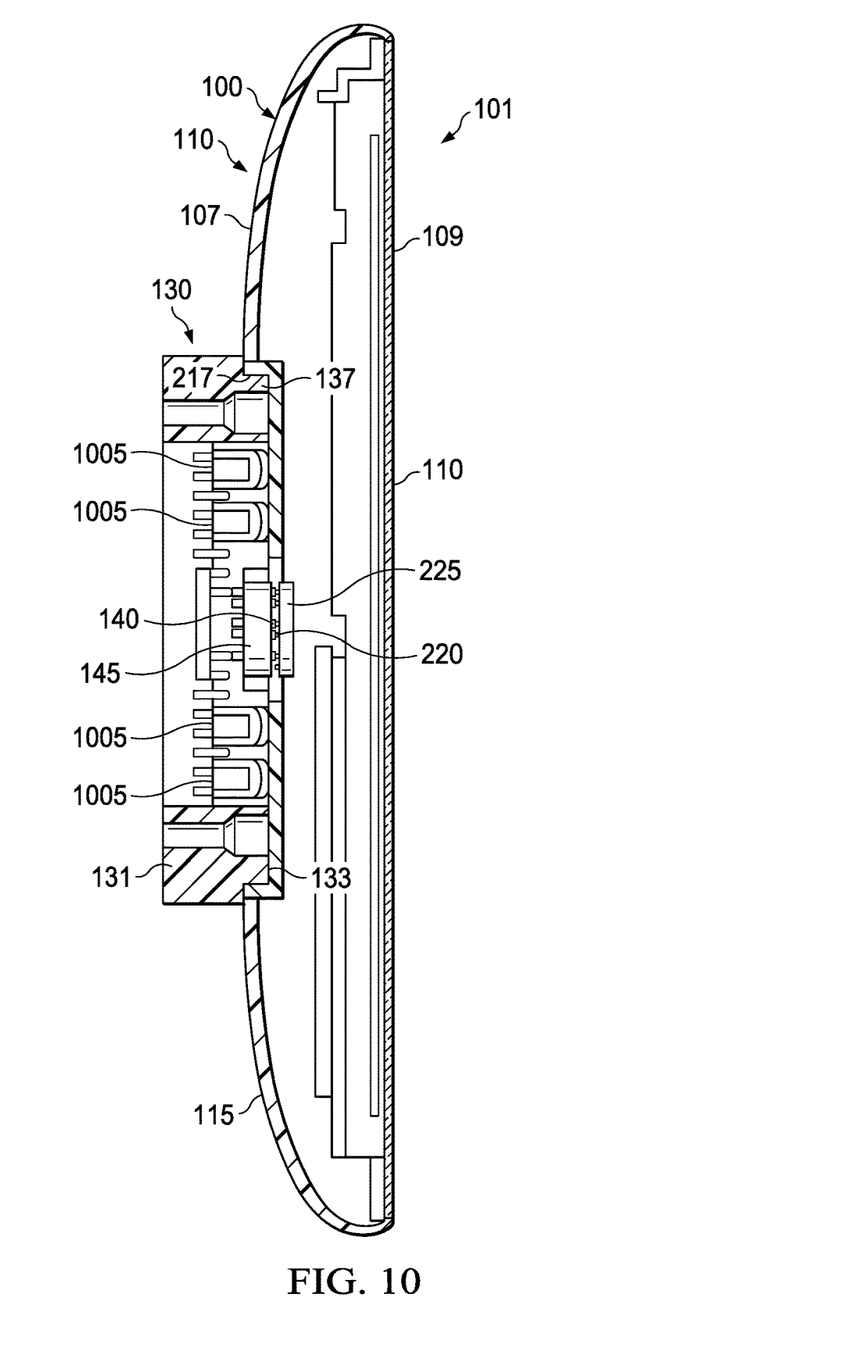
FIG. 10 is a schematic cross section of an illustrative embodiment of a thermostat mounted to a wall-mounting base according to an aspect of the present disclosure.

Referring now primarily to FIG. 10, an illustrative embodiment showing a wall-mounted thermostat system 101 having the thermostat 100 mounted to the wall-mounting base 130 is presented in an assembled position. The raised area 137 is shown received into the recessed mounting area 217 and held by magnetic elements 145, 225. The electrical contact interface 140 of the wall-mounting base 130 is electrically and rotatably coupled to the electrical contact interface 220 of the thermostat 100. In addition to the features previously described, this view also illustrates the quick connector elements 1005 that provide easy connection of the power and data lines of the HVAC unit to the wall-mounting base 130.

With reference to the figures, a rotatable interface between the wall-mounting base 130 allows the thermostat 100 to move relative to the wall-mounting base 130 and provides electrical communication between the thermostat 100 and the wall-mounting base 130. The rotatable interface may be any configuration that allows the rotation and electrical communication. In one illustrative embodiment, the rotatable interface includes for rotation the second side 133 of the wall-mounting base 130 held against the first side 107 of the thermostat by at least one magnetic element or by a mechanical coupling that provides for rotation and the electrical communication is provided by the electrical contact interface 220 of the thermostat 100 and the corresponding electrical interface 140 on the wall-mounting base 130.

In another embodiment, the rotatable interface may include the raised area 137 of the wall-mounting base and the recessed mounting area 217 of the thermostat 100. In other embodiments, the rotatable interface may include the register elements 405 of the thermostat cooperating with the second side of the wall-mounting base 130 or the protrusions 409 and the indentations 411. The rotatable interface may include the leveling register 305, 505, 605 that may enable the desired rotation and allow the components to be held in their relative position once the leveling has occurred. Still other elements and technique may be used as will be understood by a person of ordinary skill in the art with this disclosure.

One aspect of this disclosure provides a thermostat that has a leveling indicator and leveling register incorporated into the thermostat. In one embodiment, the thermostat has a user-activated electronic leveling function that appears on the display. The user activates the electronic leveling function by selecting the appropriate menu selection on the display screen of the thermostat. Once the user engages the leveling function, a leveling icon or other leveling indicia appear on the screen that the user uses to level the thermostat on the wall. In another aspect, the thermostat's housing includes a physical bubble-type level built into the frame of the thermostat's housing that the user can use to level the thermostat on the wall. In addition, the back of the thermostat housing includes a leveling register that cooperates with a corresponding leveling register on a wall-mounting base to provide a mechanism for allowing the thermostat housing to freely or incrementally rotate with respect to the wall-mounting base to achieve a leveled condition as indicated by the level indicator. The cooperating leveling registers of the thermostat and the wall-mounting base may comprise a number of different systems for allowing the free or indexed rotation of the thermostat about the wall-mounting base. These features provide the user with a system by which the user can level a thermostat in an easy and convenient manner, without the need to remove the wall-mounting base, screws, patch holes, or re-mount the wall-mounting base in an attempt to level the thermostat.

In addition to the embodiments described above, many examples of specific combinations are within the scope of the disclosure, some of which are detailed below.

Example 1

A wall-mounted thermostat system for use as an aspect of a heating, ventilation, and air conditioning (HVAC) system, the wall-mounted thermostat system including: a wall-mounting base having a first side and a second side, wherein the first side is configured at least in part to mount against the wall; a thermostat rotatably coupled to the wall-mounting base on the second side of the wall-mounting base; wherein the thermostat comprises a first accelerometer for developing leveling data with respect to a plane parallel to the wall; a rotatable interface between the wall-mounting base that allows the thermostat to move relative to the wall-mounting base and provides electrical communication between the thermostat and the wall-mounting base; and wherein the rotatable interface comprises a leveling register.

Example 2

The system of example 1, wherein the leveling register comprises a roughened surface at an interface between the second side of the wall-mounting base and the first side of the thermostat.

Example 3

The system of example 1, wherein the leveling register comprises one or more register elements coupled to the second side of the wall-mounting base or the first side of the thermostat.

Example 4

The system of example 1, wherein the leveling register comprises a plurality of register elements coupled to the first side of the thermostat and biased outwardly and a coordinated plurality of indentations on the second side of the wall-mounting base.

Example 5

The system of example 1, wherein the leveling register comprises a plurality of register elements coupled to the first side of the thermostat along a inboard circumferential path and biased outwardly and a coordinated plurality of indentations on the second side of the wall-mounting base.

Example 6

The system of example 1, wherein the leveling register comprises a plurality of register elements coupled to the second side of the wall-mounting base and biased outwardly and a coordinated plurality of indentations on the first side of the thermostat.

Example 7

The system of example 1 or any of examples 2-6, further comprising a second accelerometer for providing data concerning a plane that is substantially orthogonal to the plane of the wall.

Example 8

The system of example 1 or any of examples 2-7, wherein the rotatable interface comprises a plurality of concentric conductive rings on the first side of the thermostat and a plurality of electrical contacts on the second side of the wall-mounting base.

Example 9

The system of example 1 or any of examples 2-8, wherein the wall-mounting base and thermostat comprises a raised area and a recessed mounting area that is sized to accommodate the raised area.

Example 10

The system of example 1 or any of examples 2-8, wherein the wall-mounting base comprises a raised area on the second side of the wall-mounting base and wherein the thermostat comprises a recessed mounting area that is sized to accommodate the raised area of the wall-mounting base.

Example 11

The system of example 1, wherein the thermostat comprises a raised area on the first side of the thermostat and wherein the wall-mounting base comprises a recessed mounting area that is sized to accommodate the raised area of the thermostat.

Example 12

The system of example 1 or any of examples 2-11, wherein the thermostat is held proximate to the wall-mounting base by at least one magnetic element.

Example 13

The system of example 1 or any of examples 2-12, wherein the thermostat is held proximate to the wall-mounting base by a first magnetic element coupled to the second side of the wall-mounting base and a second magnetic element coupled to the first side of the of the thermostat.

Example 14

The system of example 1, wherein the leveling register comprises a plurality of register elements coupled to the first side of the thermostat and biased outwardly and a coordinated plurality of indentations on the second side of the wall-mounting base; further comprising a second accelerometer for providing data concerning a plan that is substantially orthogonal to the plan of the wall; wherein the rotatable interface comprises a plurality of concentric conductive rings on the first side of the thermostat and a plurality of electrical contacts on the second side of the wall-mounting base; and wherein the wall-mounting base and thermostat comprises a raised area and a recessed mounting area that is sized to accommodate the raised area.

Example 15

A method of coupling a thermostat to a wall and leveling the thermostat, the method comprising: providing a wall-mounting base; attaching the wall-mounting base to the wall; providing a thermostat that includes an accelerometer for providing leveling information; rotatably coupling the thermostat to the wall-mounting base; using the accelerometer to develop the leveling information concerning which direction of rotation is required between the wall-mounting base and the thermostat to make the thermostat level; and rotating the thermostat relative to wall-mounting base based on leveling information provided by the accelerometer.

Example 16

The method of example 15, further comprising using a leveling register to maintain a relative position of the thermostat and wall-mounting base.

Example 17

The method of example 16, wherein the level register comprises a roughened surface at an interface between the wall-mounting base and the thermostat.

Example 18

The method of example 16 or example 17, wherein the level register comprises a plurality of register elements coupled to a side of the thermostat facing the wall-mounting base and biased outwardly and a coordinated plurality of indentations on a thermostat-facing side of the wall-mounting base.

Example 19

The method of example 15 or any of examples 16-18, wherein the step of rotating the thermostat relative to wall-mounting base based on leveling information comprises using a level register to rotate the thermostat relative to the wall-mounting base.

Example 20

The method of example 15 or any of examples 16-19, wherein the step of rotatably coupling the thermostat to the wall-mounting base comprises using a first magnetic element and a second magnetic element or magnetically attractive material to develop a magnetic field between the thermostat and wall-mounting base.

In the detailed description of the illustrative embodiments herein, reference is made to the accompanying drawings that form a part hereof. These embodiments are described in sufficient detail to enable those skilled in the art to practice the invention, and it is understood that other embodiments may be utilized and that logical structural, mechanical, electrical, and chemical changes may be made without departing from the spirit or scope of the disclosure. To avoid detail not necessary to enable those skilled in the art to practice the embodiments described herein, the description may omit certain information known to those skilled in the art. The detailed description is, therefore, not to be taken in a limiting sense, and the scope of the illustrative embodiments are defined by the appended claims.

As used herein, the term "coupled" includes coupling via a separate object and includes direct coupling. The term "coupled" also encompasses two or more components that are continuous with one another by virtue of each of the components being formed from the same piece of material. Also, the term "coupled" may include chemical, such as via a chemical bond, mechanical, thermal, or electrical coupling. Fluid coupling means that fluid may be in communication between the designated parts or locations.

Although the present invention and its advantages have been disclosed in the context of certain illustrative, non-limiting embodiments, it should be understood that various changes, substitutions, permutations, and alterations can be made without departing from the scope of the invention as defined by the appended claims. It will be appreciated that any feature that is described in connection to any one embodiment may also be applicable to any other embodiment. The steps of the methods described herein may be carried out in any suitable order, or simultaneously where appropriate.

Those skilled in the art to which this application relates will appreciate that other and further additions, deletions, substitutions and modifications may be made to the described embodiments.

What is claimed is:

1. A wall-mounted thermostat system for use as an aspect of a heating, ventilation, and air conditioning (HVAC) system, the wall-mounted thermostat system comprising:
   a wall-mounting base having a first side and a second side, wherein the first side is configured at least in part to mount against a wall;
   a thermostat rotatably coupled to the wall-mounting base on the second side of the wall-mounting base, wherein the thermostat has a first side and a second side;
   wherein the thermostat comprises a first accelerometer for developing electronic leveling data with respect to a first plane that is parallel to the wall;
   a rotatable interface at an interface between the wall-mounting base and the thermostat that allows the thermostat to move relative to the wall-mounting base and provides electrical communication between the thermostat and the wall-mounting base, and wherein a portion of the rotatable interface is coupled to the thermostat and another portion of the rotatable interface is coupled to the wall-mounting base; and
   wherein the rotatable interface comprises a leveling register, wherein the leveling register comprises one or more register elements coupled to the second side of the wall-mounting base facing the first side of thermostat or the first side of the thermostat facing the second side of the wall-mounting base.

2. The system of claim 1, wherein the one or more register elements comprises a plurality of register elements coupled to the first side of the thermostat and biased outwardly and a coordinated plurality of indentations on the second side of the wall-mounting base.

3. The system of claim 1, wherein the one or more register elements comprises a plurality of register elements coupled to the first side of the thermostat along a inboard circumferential path and biased outwardly and a coordinated plurality of indentations on the second side of the wall-mounting base.

4. The system of claim 1, wherein the one or more register elements comprises a plurality of register elements coupled to the second side of the wall-mounting base and biased outwardly and a coordinated plurality of indentations on the first side of the thermostat.

5. The system of claim 1, wherein the thermostat further comprises a second accelerometer for providing data concerning a second plane that is substantially orthogonal to the first plane of the wall when in an installed position.

6. The system of claim 1, wherein the rotatable interface comprises a plurality of concentric conductive rings on the first side of the thermostat and a plurality of electrical contacts on the second side of the wall-mounting base.

7. The system of claim 1, wherein the wall-mounting base and the thermostat comprises a raised area and a recessed mounting area, wherein the recessed mounting area is sized to accommodate the raised area.

8. The system of claim 1, wherein the wall-mounting base comprises a raised area on the second side of the wall-mounting base and wherein the thermostat comprises a recessed mounting area that is sized to accommodate the raised area of the wall-mounting base.

9. The system of claim 1, wherein the thermostat comprises a raised area on the first side of the thermostat and wherein the wall-mounting base comprises a recessed mounting area that is sized to accommodate the raised area of the thermostat.

10. The system of claim 1, wherein the thermostat is held proximate to the wall-mounting base by at least one magnetic element.

11. The system of claim 1, wherein the thermostat is held proximate to the wall-mounting base by a first magnetic element coupled to the second side of the wall-mounting base and a second magnetic element coupled to the first side of the of the thermostat.

12. The system of claim 1,
wherein the one or more register elements comprises a plurality of register elements coupled to the first side of the thermostat and biased outwardly and a coordinated plurality of indentations on the second side of the wall-mounting base;
the thermostat further comprising a second accelerometer for providing data concerning a second plane that is substantially orthogonal to the first plane of the wall;
wherein the rotatable interface comprises a plurality of concentric conductive rings on the first side of the thermostat and a plurality of electrical contacts on the second side of the wall-mounting base; and
wherein the wall-mounting base and thermostat comprises a raised area and a recessed mounting area, wherein the recessed area is sized to accommodate the raised area.

13. A wall-mounted thermostat system for use as an aspect of a heating, ventilation, and air conditioning (HVAC) system, the wall-mounted thermostat system comprising:
a wall-mounting base having a first side and a second side, wherein the first side is configured at least in part to mount against a wall;
a thermostat rotatably coupled to the wall-mounting base on the second side of the wall-mounting base, wherein the thermostat has a first side and a second side;
wherein the thermostat comprises a first accelerometer for developing electronic leveling data with respect to a first plane that is parallel to the wall;
a rotatable interface positioned between the wall-mounting base and the thermostat that allows the thermostat to move relative to the wall-mounting base and provides electrical communication between the thermostat and the wall-mounting base, and wherein a portion of the rotatable interface is coupled to the thermostat and another portion of the rotatable interface is coupled to the wall-mounting base; and
wherein the rotatable interface comprises a leveling register, wherein the leveling register comprises at least one of roughened surface at an interface between the second side of the wall-mounting base and the first side of the thermostat.

14. The wall-mounted thermostat system of claim 13, wherein the least one of roughened surface at an interface between the second side of the wall-mounting base and the first side of the thermostat comprises a first roughened surface formed on the second side of the wall-mounting base and a second roughened surface formed on the first side of the thermostat, wherein when installed the first roughened surface is against the second roughened surface.

\* \* \* \* \*